(12) United States Patent
Bodea et al.

(10) Patent No.: US 10,896,887 B2
(45) Date of Patent: Jan. 19, 2021

(54) STRESS RELIEVING STRUCTURE FOR SEMICONDUCTOR DEVICE

(71) Applicant: Infineon Technologies AG, Neubiberg (DE)

(72) Inventors: Marius Aurel Bodea, Villach (AT); Terry Richard Heidmann, Otterfing (DE); Marianne Mataln, Villach (AT); Claudia Sgiarovello, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/295,856

(22) Filed: Mar. 7, 2019

(65) Prior Publication Data

US 2019/0348382 A1 Nov. 14, 2019

Related U.S. Application Data

(63) Continuation-in-part of application No. 15/976,653, filed on May 10, 2018, now abandoned.

(51) Int. Cl.
*H01L 23/00* (2006.01)

(52) U.S. Cl.
CPC .............. *H01L 24/05* (2013.01); *H01L 24/32* (2013.01); *H01L 2224/0214* (2013.01); *H01L 2224/0215* (2013.01); *H01L 2224/02145* (2013.01); *H01L 2224/04026* (2013.01); *H01L 2224/05017* (2013.01); *H01L 2224/05018* (2013.01); *H01L 2224/05082* (2013.01); *H01L 2224/05083* (2013.01); *H01L 2224/05124* (2013.01); *H01L 2224/05147* (2013.01); *H01L 2224/32245* (2013.01); *H01L 2924/3511* (2013.01)

(58) Field of Classification Search
None
See application file for complete search history.

(56) References Cited

U.S. PATENT DOCUMENTS

| 2004/0070042 | A1 | 4/2004 | Lee et al. |
| 2007/0123009 | A1* | 5/2007 | Richter ............. H01L 21/76808 438/479 |
| 2009/0079085 | A1 | 3/2009 | Hannuki et al. |
| 2009/0114984 | A1 | 5/2009 | Stecher et al. |

(Continued)

FOREIGN PATENT DOCUMENTS

EP 1835544 A2 9/2007

*Primary Examiner* — Nishath Yasmeen
(74) *Attorney, Agent, or Firm* — Murphy, Bilak & Homiller, PLLC

(57) ABSTRACT

A semiconductor device includes a semiconductor body, a stress relieving layer or layer stack disposed over at least part of the semiconductor body, the stress relieving layer or layer stack comprising a plurality of openings which yield a patterned surface topography for the stress relieving layer or layer stack, and a metal layer or layer stack formed on the stress relieving layer or layer stack and occupying the plurality of openings in the stress relieving layer or layer stack. The patterned surface topography of the stress relieving layer or layer stack is transferred to a surface of the metal layer or layer stack facing away from the semiconductor body. The stress relieving layer or layer stack has a different elastic modulus than the metal layer or layer stack over a temperature range.

22 Claims, 15 Drawing Sheets

(56) References Cited

U.S. PATENT DOCUMENTS

| | | | |
|---|---|---|---|
| 2009/0166850 A1* | 7/2009 | Jeon | H01L 23/49562 |
| | | | 257/706 |
| 2011/0230046 A1 | 9/2011 | Gruenhagen et al. | |
| 2011/0298048 A1 | 12/2011 | Senoo et al. | |
| 2012/0261817 A1 | 10/2012 | Do et al. | |
| 2013/0093077 A1* | 4/2013 | Liang | H01L 21/76841 |
| | | | 257/737 |
| 2013/0228897 A1* | 9/2013 | Chen | H01L 23/49816 |
| | | | 257/621 |
| 2014/0264766 A1 | 9/2014 | Wang et al. | |
| 2017/0162540 A1* | 6/2017 | Ji | H01L 24/05 |

* cited by examiner

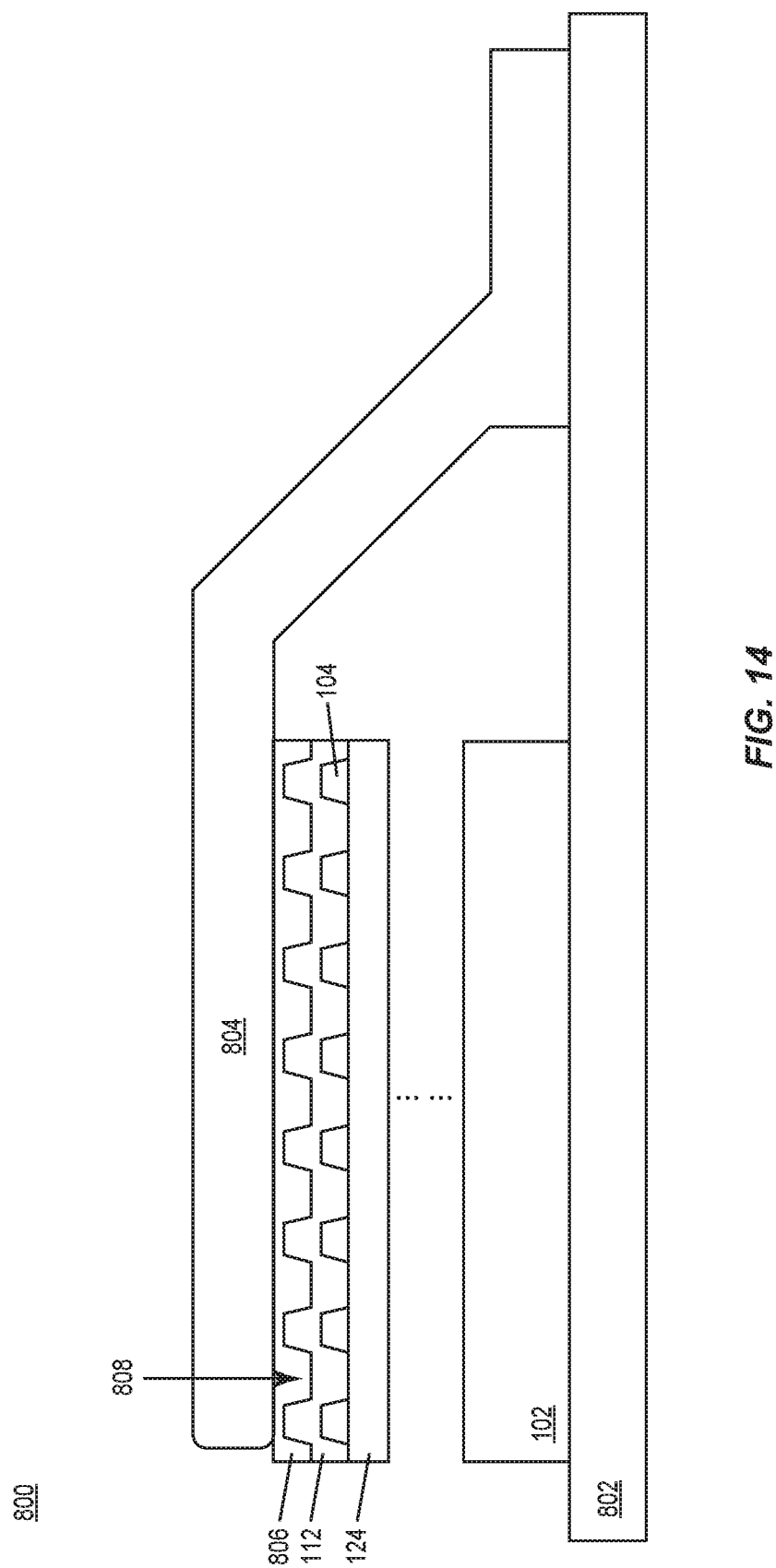

STRESS RELIEVING STRUCTURE FOR SEMICONDUCTOR DEVICE

BACKGROUND

Demand for power semiconductor devices with lower on-state resistance (RdsON) values, smaller die (chip) area, and smaller packaging is increasing. In addition to technical advances in semiconductor processing and concept cell design, improvements in die metallization and package-to-die interaction are needed to meet this increased demand. Recent advancements in die metallization and package-to-die interaction include the use of copper metallization on the die and the use of copper clips in the packaging.

The introduction of copper metallization brings new challenges in the die-to-package interaction as compared to standard aluminum metallization. Increased die bow/warpage and higher residual stress within the die after the soldering process are two examples of challenges exasperated by incorporating copper into die and packaging technologies. Die bow/warpage and residual stress may dramatically influence the die and clip attach processes, leading to formation of voids in the solder and a tilted die with respect to the lead frame or other substrate to which the die is attached.

The formation of voids within the conductive connection, for example between the die and die attach substrate or between the die and clip, can hinder electrical and thermal properties of the packaged device to such an extent that early failure may occur. Moreover, package devices with such voids cannot always be screened.

If a die is titled with respect to the substrate to which it is attached, an unusually small amount of solder may be present under one corner or edge of the die as compared to the other corners/edges. The unusually small amount of solder may degrade during temperature cycling, leading to early failure of the device.

Hence, more robust techniques which reduce die bow/warpage and higher residual stress within a die are needed.

SUMMARY

According to an embodiment of a semiconductor device, the semiconductor device comprises a semiconductor body, a stress relieving layer or layer stack disposed over at least part of the semiconductor body, the stress relieving layer or layer stack comprising a plurality of openings which yield a patterned surface topography for the stress relieving layer or layer stack, and a metal layer or layer stack formed on the stress relieving layer or layer stack and occupying the plurality of openings in the stress relieving layer or layer stack. The patterned surface topography of the stress relieving layer or layer stack is transferred to a surface of the metal layer or layer stack facing away from the semiconductor body. The stress relieving layer or layer stack has a different elastic modulus than the metal layer or layer stack over a temperature range. In one embodiment, the stress relieving layer or layer stack has a smaller elastic modulus than the metal layer or layer stack over a temperature range. In another embodiment, the stress relieving layer or layer stack has a higher elastic modulus than the metal layer or layer stack over a temperature range.

In an embodiment, the stress relieving layer or layer stack may comprise a material selected from the group consisting of a polymer, an imide, an alloy of aluminum and copper, an oxide, a nitride, silicon nitride, oxynitride, a nitride-based ceramic, and SiCOH.

Separately or in combination, the semiconductor device may further comprise a wiring layer on which the stress relieving layer or layer stack is formed, wherein the metal layer or layer stack may be in electrical contact with the wiring layer through the plurality of openings in the stress relieving layer or layer stack. The plurality of openings in the stress relieving layer or layer stack may be arranged independent of a layout of the wiring layer.

Separately or in combination, the metal layer or layer stack may be an uppermost metal layer of the semiconductor device. Part of the stress relieving layer or layer stack may be free of openings or have a large opening to provide a generally planar surface topography over which the metal layer or layer stack may comprise one or more contact pads.

Separately or in combination, the plurality of openings in the stress relieving layer or layer stack may be arranged in a regular pattern so that the patterned surface topography of the stress relieving layer or layer stack may have a regular pattern.

Separately or in combination, the plurality of openings in the stress relieving layer or layer stack may be arranged in a checkerboard pattern, a honeycomb pattern or in stripes so that the patterned surface topography of the stress relieving layer or layer stack may have a checkerboard pattern, a honeycomb pattern or a striped pattern, respectively.

Separately or in combination, the stress relieving layer or layer stack may have a corrugated profile with alternating ridges and grooves in a cross-section through any row of the plurality of openings.

Separately or in combination, the plurality of openings in the stress relieving layer or layer stack may comprise an arrangement of regularly-spaced openings of the same or substantially same shape. For example, the shape of the regularly-spaced openings may be selected from the group consisting of square, rectangular, hexagonal, ellipsoidal, and polygonal.

Separately or in combination, the plurality of openings in the stress relieving layer or layer stack may comprise rows of regularly spaced openings of the same shape.

Separately or in combination, the stress relieving layer or layer stack may cover between 10% and 100% of an entire main surface of the semiconductor body over which the stress relieving layer or layer stack is disposed. For example, the stress relieving layer or layer stack may cover the entire main surface of the semiconductor body over which the stress relieving layer or layer stack is disposed.

Separately or in combination, the plurality of openings may be formed in the stress relieving layer or layer stack over a first part of the semiconductor body, and the stress relieving layer or layer stack may be free of openings or have a large opening over a second part of the semiconductor body adjacent the first part to provide a generally planar surface topography. For example, the first part of the semiconductor body may be a central part of the semiconductor body and the second part of the semiconductor body may be a periphery region of the semiconductor body which laterally surrounds the central part.

Separately or in combination, the metal layer or layer stack may comprise: a barrier metal layer covering a top main surface of the stress relieving layer or layer stack and sidewalls of the openings in the stress relieving layer or layer stack; and a copper layer covering the barrier metal layer.

Separately or in combination, in a same row of the openings in the stress relieving layer or layer stack, a spacing between adjacent ones of the openings may be approximately equal to a width of the openings.

Separately or in combination, the metal layer or layer stack may comprise copper.

Separately or in combination, the stress relieving layer or layer stack may be formed on an AlCu layer, and the metal layer or layer stack may be in electrical contact with the AlCu layer through the plurality of openings or through a large opening in the stress relieving layer or layer stack.

Separately or in combination, the stress relieving layer or layer stack may comprise a doped region and/or polysilicon at a rear main surface of the semiconductor body which is structured with recesses and the metal layer or layer stack may comprise a barrier layer covering the structured rear main surface of the semiconductor body and a copper layer formed on the barrier layer and filling the recesses in the structured rear main surface of the semiconductor body.

According to an embodiment of a method of manufacturing a semiconductor device, the method comprises: forming one or more devices in a semiconductor body; forming a stress relieving layer or layer stack over at least part of the semiconductor body; forming a plurality of openings in the stress relieving layer or layer stack and which yield a patterned surface topography for the stress relieving layer or layer stack; and forming a metal layer or layer stack on the stress relieving layer or layer stack so that the metal layer or layer stack occupies the plurality of openings in the stress relieving layer or layer stack and the patterned surface topography of the stress relieving layer or layer stack transfers to a surface of the metal layer or layer stack facing away from the semiconductor body, the metal layer or layer stack having a different elastic modulus than the stress relieving layer or layer stack over a temperature range. In one embodiment, the metal layer or layer stack has higher elastic modulus than the stress relieving layer or layer stack over a temperature range. In another embodiment, the metal layer or layer stack has smaller elastic modulus than the stress relieving layer or layer stack over a temperature range. Separately or in combination, forming the stress relieving layer or layer stack over at least part of the semiconductor body may comprise forming a doped region and/or polysilicon at the rear main surface of the semiconductor body and structuring the rear main surface so as to have recesses, and forming the metal layer or layer stack on the stress relieving layer or layer stack may comprise covering the structured rear main surface of the semiconductor body with a barrier layer and filling the recesses with a copper layer formed on the barrier layer.

According to an embodiment of a semiconductor package, the semiconductor package comprises a semiconductor device comprising: a semiconductor body; a stress relieving layer or layer stack disposed over at least part of the semiconductor body, the stress relieving layer or layer stack comprising a plurality of openings which yield a patterned surface topography for the stress relieving layer or layer stack; and a metal layer or layer stack formed on the stress relieving layer or layer stack and occupying the plurality of openings in the stress relieving layer or layer stack. The patterned surface topography of the stress relieving layer or layer stack is transferred to a surface of the metal layer or layer stack facing away from the semiconductor body. The stress relieving layer or layer stack has a different elastic modulus than the metal layer or layer stack over a temperature range. The semiconductor package further comprises a metal connector attached to the metal layer or layer stack. In one embodiment, the stress relieving layer or layer stack has a smaller elastic modulus than the metal layer or layer stack over a temperature range. In another embodiment, the stress relieving layer or layer stack has a higher elastic modulus than the metal layer or layer stack over a temperature range.

In an embodiment, part of the stress relieving layer or layer stack may be free of openings or have a larger opening to provide a generally planar surface topography over which the metal layer or layer stack may comprise a contact pad, and the metal connector may be attached to the contact pad.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

FIG. 14 illustrates a cross-sectional view of a semiconductor package that includes the semiconductor device shown in FIG. 1.

DETAILED DESCRIPTION

Embodiments described herein provide a stress relieving layer or layer stack disposed over at least part of a semiconductor body, for counteracting stress imparted by a metal layer or layer stack disposed above the stress relieving layer or layer stack. The stress relieving layer or layer stack has a plurality of openings which yield a patterned surface topography. The patterned surface topography for the stress relieving layer or layer stack is transferred to the surface of the metal layer or layer stack facing away from the semiconductor body. The stress relieving layer or layer stack absorbs at least some of the stress imparted by the metal layer or layer stack during temperature cycling and/or residual stress stored within the metal layer or layer stack, reducing the likelihood of die bow/warpage and high mechanical stress.

Figure 1:
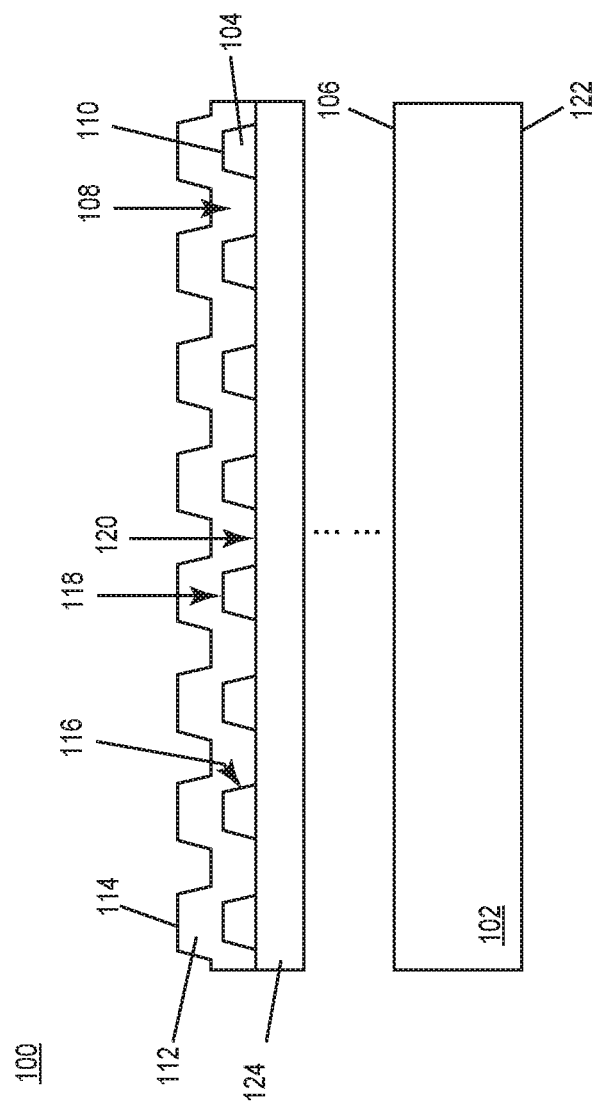
FIG. 1 illustrates a cross-sectional view of part of a semiconductor device having a stress relieving layer or layer stack.

FIG. 1 illustrates a cross-sectional view of part of a semiconductor device 100. The semiconductor device 100 includes a semiconductor body 102. The semiconductor body 102 may be part of a semiconductor wafer prior to die singulation, or may be part of a semiconductor die (chip) post die singulation. In either case, one or more passive and/or active devices may be formed in the semiconductor body 102. For example, a logic device such as a processor, ASIC (application-specific integrated-circuit), memory, controller, etc. may be formed in the semiconductor body 102. In addition or alternatively, a power device such as an insulated gate bipolar transistor (IGBT), power metal-oxide-semiconductor field effect transistor (MOSFET), high-electron mobility transistor (HEMT), power diode, half-bridge, full-bridge, etc. may be formed in the semiconductor body 102. In addition or alternatively, a sensor such as a Hall sensor, microelectromechanical systems (MEMS), etc. may be formed in the semiconductor body 102. Still other types of passive and/or active devices may be formed in the semiconductor body 102. The device(s) formed in the semiconductor body 102 are not shown in FIG. 1 for ease of illustration, but may include doped regions of different conductivity types, gate structures, trenches, field plates, ohmic contacts, etc.

A stress relieving layer (i.e. a single stress relieving layer) or layer stack (i.e. more than one stress relieving layer stacked one above the other) 104 is disposed over at least part of the semiconductor body 102. That is, the stress relieving layer or layer stack 104 covers all or only a portion of the semiconductor body 102. For example, the stress relieving layer or layer stack 104 may cover between 10% and 100% of the entire main surface 106 of the semiconductor body 102 over which the stress relieving layer or layer stack 104 is disposed. In one embodiment, the stress relieving layer or layer stack 104 may cover the entire main surface 106 of the semiconductor body 102 over which the stress relieving layer or layer stack 104 is disposed.

The stress relieving layer or layer stack 104 has a plurality of openings 108 which yield a patterned surface topography for the stress relieving layer or layer stack 104. That is, the surface 110 of the stress relieving layer or layer stack 104 facing away from the semiconductor body 102 has a patterned shape which is defined by the number, spacing, shape and dimensions of the openings 108 formed in the stress relieving layer or layer stack 104. The openings 108 in the stress relieving layer or layer stack 104 may be arranged in a regular or irregular pattern so that the patterned surface topography of the stress relieving layer or layer stack 104 has a corresponding regular or irregular pattern, respectively. The openings 108 may be formed by a standard etch process such as masking and wet or dry etching of the stress relieving layer or layer stack 104, by laser drilling of the stress relieving layer or layer stack 104, by patterned deposition of the stress relieving layer or layer stack 104, etc.

A metal layer (i.e. a single metal layer) or layer stack (i.e. more than one metal layer stacked one above the other) 112 is formed on the stress relieving layer or layer stack 104 and occupies the openings 108 in the stress relieving layer or layer stack 104. The metal layer or layer stack 112 may partly or completely fill the openings 108 in the stress relieving layer or layer stack 104. Any commonly used metal(s) or metal stack in the semiconductor industry may be used.

The patterned surface topography of the stress relieving layer or layer stack 104 is transferred to the surface 114 of the metal layer or layer stack 112 facing away from the semiconductor body 102. Accordingly, the surface 114 of the metal layer or layer stack 112 facing away from the semiconductor body 102 has the same or substantially same patterned shape as the surface 110 of the stress relieving layer or layer stack 104 facing away from the semiconductor body 102. While the metal layer or layer stack 112 and the stress relieving layer or layer stack 104 have the same or substantially same general shape/structure/contour, the relative dimensions may differ. For example, the vertical sidewalls 116 of the openings 108 in the stress relieving layer or layer stack 104 may be covered with slightly more or slightly less material than the horizontal parts 118, and the thickness of the metal layer or layer stack 112 along the sidewalls 116 of the openings 108 may be different than the thickness of the metal layer or layer stack 112 at the bottom 120 of the openings 108 and on the horizontal parts 118 of the stress relieving layer or layer stack 104. Also, the surface 114 of the metal layer or layer stack 112 with the patterned topography is not planarized. Hence, the metal layer or layer stack 112 retains the patterned surface topography transferred from the stress relieving layer or layer stack 104. The metal layer or layer stack 112 may be a thick layer such that the patterned surface topography transferred from the stress relieving layer or layer stack 104 may be barely visible.

The stress relieving layer or layer stack 104 also has a different elastic modulus (e.g. Young's modulus) than the metal layer or layer stack 112 over a temperature range, which may or may not be the full (entire) operating range of the semiconductor device 100. In one embodiment, the stress relieving layer or layer stack 104 has a smaller elastic modulus than the metal layer or layer stack 112 over the temperature range of interest. For example, the stress relieving layer or layer stack 104 may comprise one or more of a stable or dissolvable polymer, an imide, an alloy of aluminum and copper, and an oxide. The stress relieving layer or layer stack 104 absorbs at least some of the stress imparted by the metal layer or layer stack 112 during temperature cycling and/or residual stress stored within the metal layer or layer stack 112, reducing the likelihood of die bow/warpage and high mechanical stress.

In another embodiment, the stress relieving layer or layer stack 104 has a higher elastic modulus than the metal layer or layer stack 112 over the temperature range of interest. For example, the stress relieving layer or layer stack 104 may comprise one or more of a tungsten-based alloy, e.g., with titanium or nitride, nickel or a nickel-based alloy, e.g., with vanadium or phosphorus, doped silicon and/or polysilicon.

In the case of doped silicon, the rear main surface 122 of the semiconductor body 102 may be doped with phosphorus, then structured, e.g., by etching, and then filled, e.g., with copper. The stress relieving layer or layer stack 104 may compensate some of the stress imparted by the metal layer or layer stack 112 during temperature cycling and/or residual stress in a way to reduce the likelihood of die bow/warpage and high mechanical stress.

The metal layer or layer stack 112 and the corresponding stress relieving layer or layer stack 104 may be applied over either side of the semiconductor body 102. That is, the metal layer or layer stack 112 and the corresponding stress relieving layer or layer stack 104 may be applied over the front main surface 106 of the semiconductor body 102, over the rear main surface 122 of the semiconductor body 102, or over both main surfaces 106, 122.

The metal layer or layer stack 112 with the same or substantially same patterned surface topography as the stress relieving layer or layer stack 104 may be the uppermost (final) metallization of the semiconductor device 100. In this case, the metal layer or layer stack 112 provides one or more points of external electrical contact for the device(s) formed in the semiconductor body 102. For example, the metal layer or layer stack 112 may include a gate pad, a source pad and/or drain pad in the case of a power transistor device such as an IGBT, bipolar transistor, HEMT, MEMS, etc. The metal layer or layer stack 112 may include an anode pad and/or a cathode pad in the case of a power diode device. The metal layer or layer stack 112 may include a substantial number of pads in the case of a logic device.

The metal layer or layer stack 112 with the same or substantially same patterned surface topography as the stress relieving layer or layer stack 104 instead may be the lowermost (first) metallization closest to the semiconductor body 102. In this case, an additional layer or layer stack 124 such as an oxide or one or more additional metal layers or layer stacks may be provided above the metal layer or layer stack 112. The number and composition of layers disposed above the metal layer or layer stack 112 may vary for different areas of the semiconductor device 100 independent of the metal layer or layer stack 112 and stress relieving layer or layer stack 104. The metal layer or layer stack 112 with the same or substantially same patterned surface topography as the stress relieving layer or layer stack 104 instead may be an intermediary metallization. In this case, one or more additional metal layers or layer stacks are formed above the intermediary metal layer or layer stack and one or more additional metal layers or layer stacks are formed below the intermediary metal layer or layer stack, with an interlayer dielectric separating the different metallization layers.

FIG. 1 shows the metal layer or layer stack 112 as either the uppermost (final) metallization or as an intermediary metallization. In this case, one or more additional metallization layers may be provided between the metal layer or layer stack 112 and the semiconductor body 102, and additional layer(s) may be disposed between the intermediary metallization and the semiconductor substrate as indicated by the vertical dotted line.

For example, one of the additional layer or layer stack 124 may be an additional metallization such as a wiring layer on which the stress relieving layer or layer stack 104 is formed. The metal layer or layer stack 112 with the same or substantially same patterned surface topography as the stress relieving layer or layer stack 104 may be in electrical contact with the additional metallization layer through the openings 108 in the stress relieving layer or layer stack 104. In one embodiment, the openings 108 in the stress relieving layer or layer stack 104 are arranged independent of the layout of the additional metallization layer 124. That is, while the openings 108 in the stress relieving layer or layer stack 104 enable electrical contact between the two metallization layers 112, 124 separated by the stress relieving layer or layer stack 104, the layout of the openings 108 is designed so that the stress relieving layer or layer stack 104 absorbs at least some of the stress imparted by the overlying metal layer or layer stack 112 during temperature cycling and/or residual stress stored within the metal layer or layer stack 112.

Figure 2:
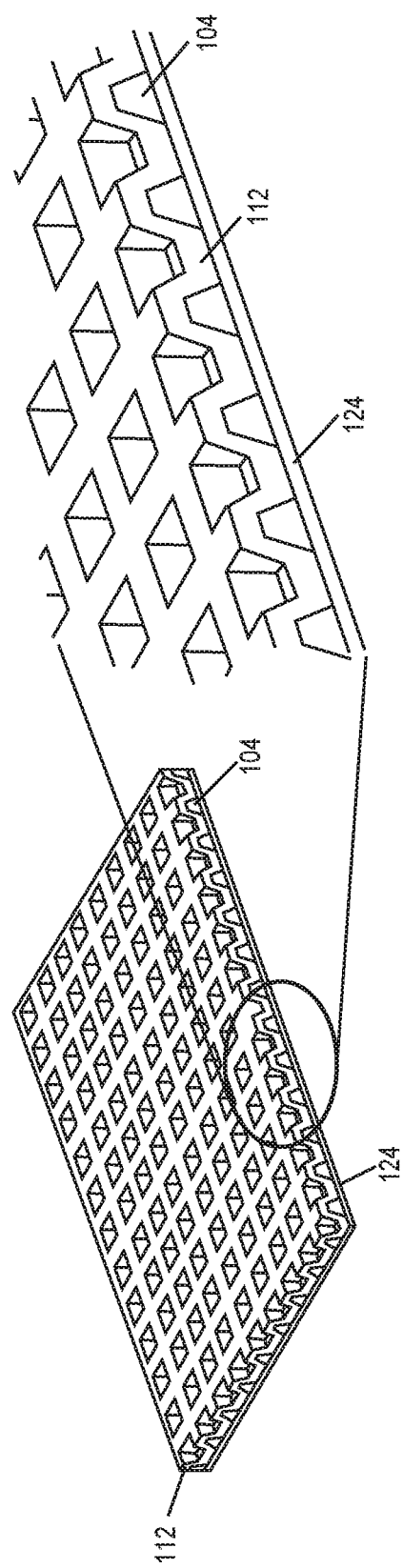
FIG. 2 illustrates a perspective view of the stress relieving layer or layer stack and a metal layer or layer stack formed on the stress relieving layer or layer stack.
Figure 3:
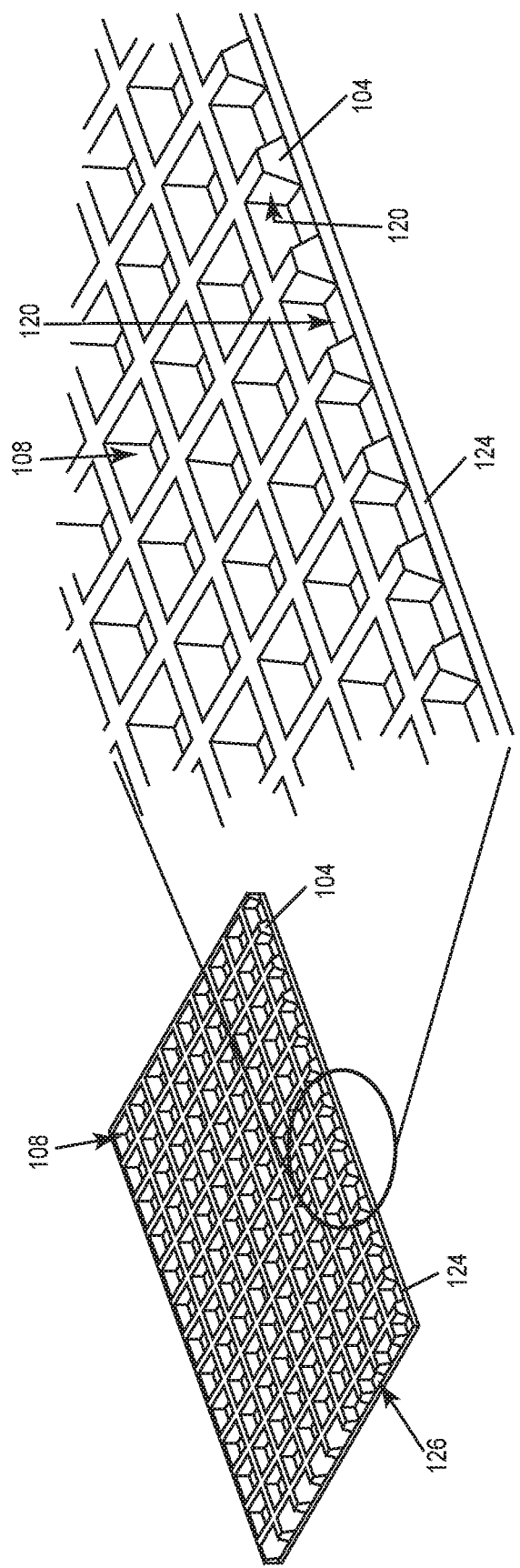
FIG. 3 illustrates a perspective view of the stress relieving layer or layer stack without the metal layer or layer stack.

FIG. 2 illustrates a perspective view of the stress relieving layer or layer stack 104 and the metal layer or layer stack 112 with the same or substantially same patterned surface topography, according to an embodiment. FIG. 3 illustrates a perspective view of the stress relieving layer or layer stack 104 without the metal layer or layer stack 112. According to this embodiment, the stress relieving layer or layer stack 104 has rows 126 of regularly-spaced openings 108 of the same or substantially same shape. The shape of the regularly-spaced openings 108 may be square, rectangular, hexagonal, ellipsoidal, polygonal, etc. While the openings 108 in the stress relieving layer or layer stack 104 are shown as being arranged in a regular pattern in FIGS. 2 and 3, the pattern instead may be irregular. In either case, the patterned surface topography of the stress relieving layer or layer stack 104 is transferred to the metal layer or layer stack 112 formed on the stress relieving layer or layer stack 104 so that the metal layer or layer stack 112 has the same or substantially same patterned surface topography as the stress relieving layer or layer stack 104.

Figure 4A:
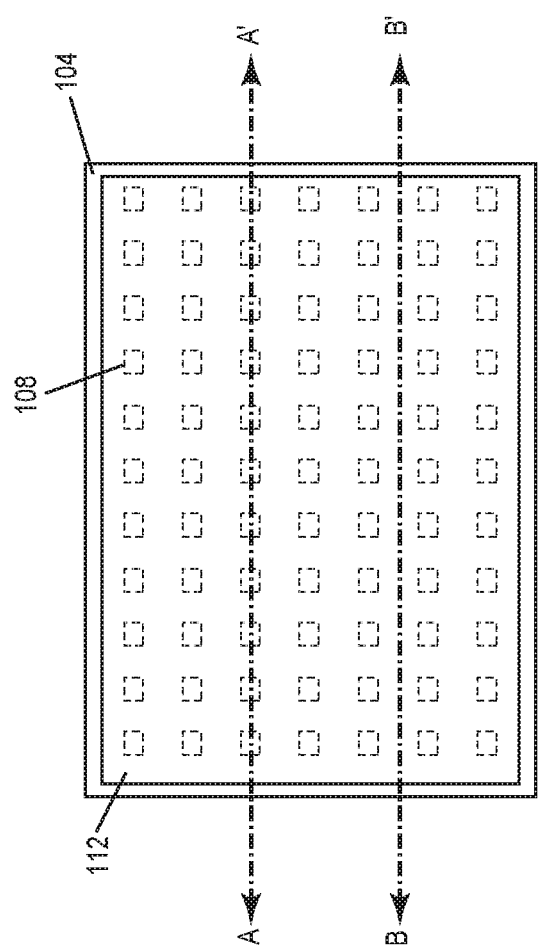
FIG. 4A illustrates a plan view of the metal layer or layer stack formed on the stress relieving layer or layer stack.
Figure 4B:
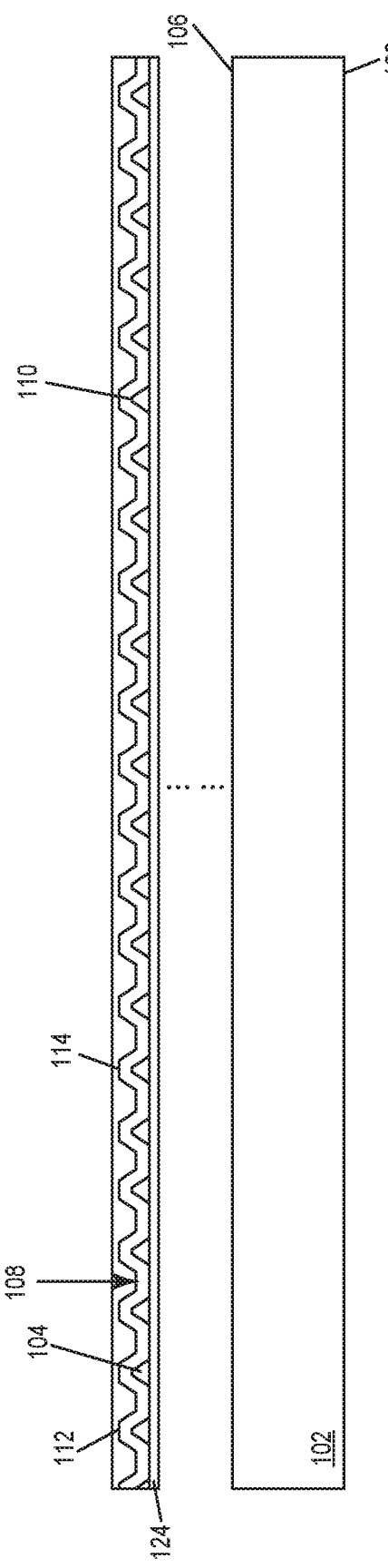
FIG. 4B illustrates a cross-sectional view of the structure taken through the line labeled A-A' in FIG. 4A.
Figure 4C:
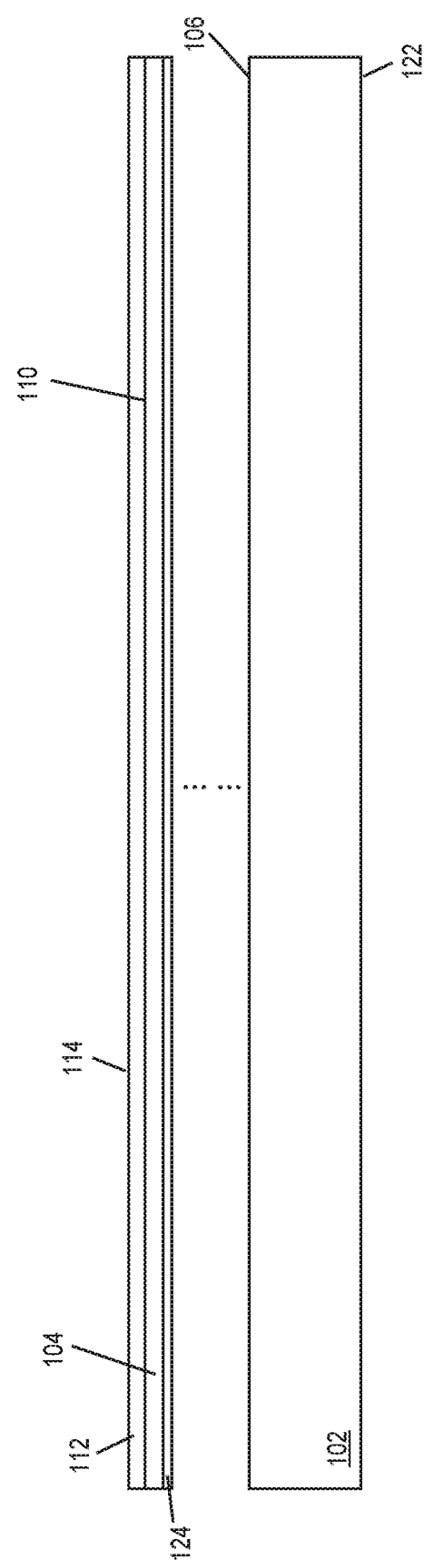
FIG. 4C illustrates a cross-sectional view of the structure taken through the line labeled B-B' in FIG. 4A.

FIG. 4A illustrates a plan view of the metal layer or layer stack 112 formed on the stress relieving layer or layer stack 104. FIG. 4B illustrates a cross-sectional view of the structure taken through the line labeled A-A' in FIG. 4A. FIG. 4C illustrates a cross-sectional view of the structure taken through the line labeled B-B' in FIG. 4A. As described above, the metal layer or layer stack 112 may be the uppermost (final) metallization, lowermost (first) metallization or an intermediary metallization.

The cross-sectional in FIG. 4B transects through a row of the openings 108 in the stress relieving layer or layer stack 104, whereas the cross-sectional in FIG. 4C transects through the structure between adjacent rows 108. According to this embodiment, the stress relieving layer or layer stack 104 covers the entire main surface 106 of the semiconductor body 102 over which the stress relieving layer or layer stack 104 is disposed. As shown in FIGS. 4B and 4C, the surface topography of the metal layer or layer stack 112 follows the surface topography of the stress relieving layer or layer stack 104. That is, the surface 114 of the metal layer or layer stack 112 facing away from the semiconductor body 102 has the same or substantially same patterned shape as the surface 110 of the stress relieving layer or layer stack 104 facing away from the semiconductor body 102.

Figure 5:
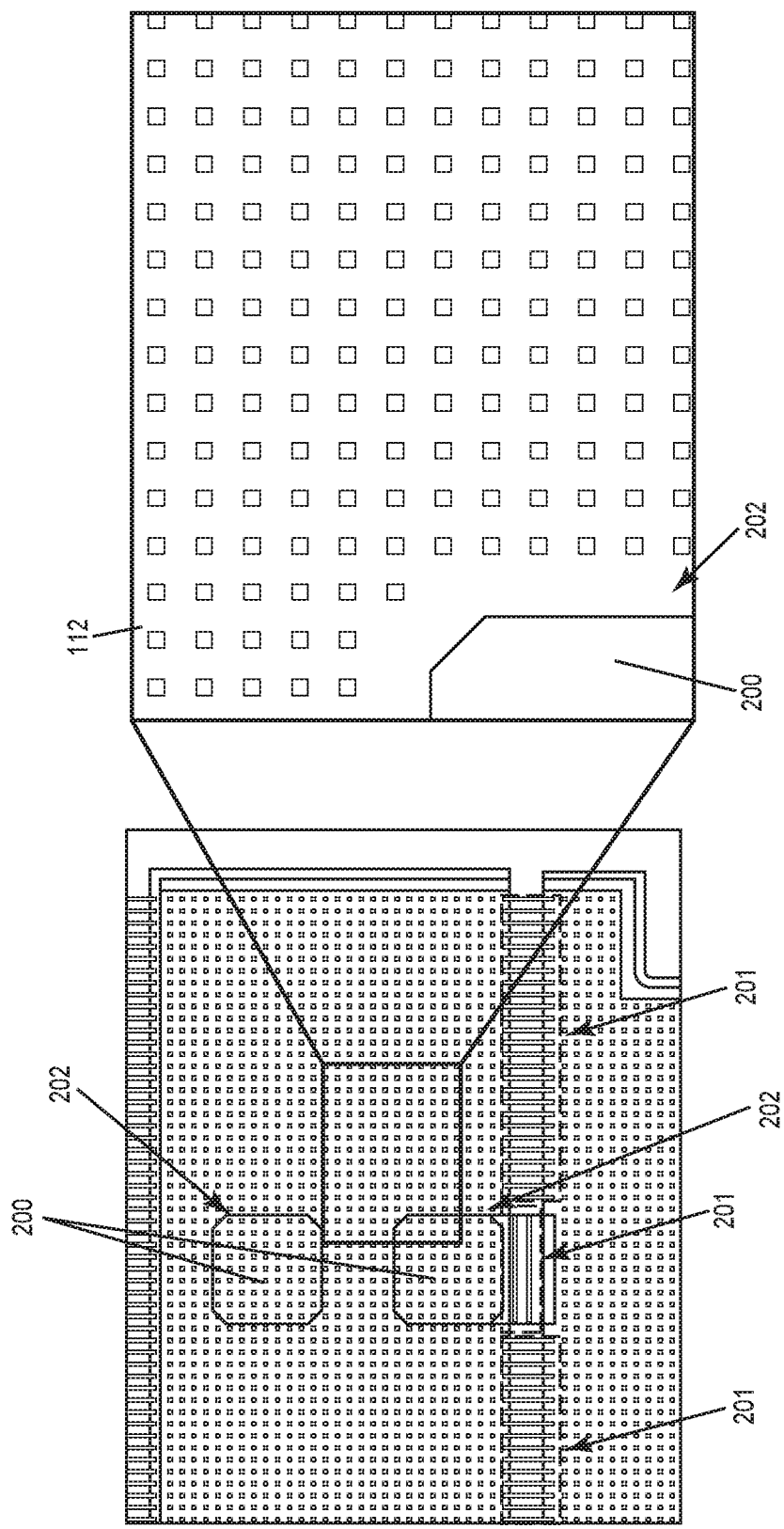
FIG. 5 illustrates a plan view of another embodiment of the metal layer or layer stack formed on the stress relieving layer or layer stack.

FIG. 5 illustrates a plan view of another embodiment of the metal layer or layer stack 112 formed on the stress relieving layer or layer stack 104. According to this embodiment, the metal layer or layer stack 112 is the uppermost (final) metal layer of the semiconductor device 100. The stress relieving layer or layer stack 104 is out of view in FIG. 5. However, part of the stress relieving layer or layer stack 104 is free of openings and has a generally planar surface topography. The generally planar surface topography is transferred to the metal layer or layer stack 112. The metal layer or layer stack 112 may include one or more contact pads 200 disposed over the part of the stress relieving layer or layer stack 104 which is free of openings, e.g. in the case of a current or temperature sensor routed in the planar part of the metal layer or layer stack 112. That is, the one or more contact pads 200 are formed in a part 202 of the metal layer or layer stack 112 that has a generally planar surface topography. In another embodiment, part of the stress relieving layer or layer stack 104 has a large opening to provide a generally planar surface topography over which the one or more contact pads 200 are formed, e.g. to contact a metal layer disposed below the stress relieving layer or layer stack 104. In either case, each contact pad 200 has a relatively top planar surface. External electric connections can be made to the one or more contact pads 200, e.g., by way of bond wires, metal ribbons, metal clips, solder, etc. The remainder of the metal layer or layer stack 112 has a nonplanar surface topography which mimics the nonplanar surface topography of the underlying stress relieving layer or layer stack 104. The exploded view in FIG. 5 enlarges the border between the planar and nonplanar surface topographies of the metal layer or layer stack 112.

The metal layer or layer stack 112 may include one or more bridge areas 201 for electrically connecting neighboring regions of the metal layer or layer stack 112 without connecting the metal layer or layer stack 112 to an underlying conductive structure such as a metal or polysilicon line. The underlying conductive structure may be a source finger, gate finger, etc. routed under the metal layer or layer stack 112. The stress relieving layer or layer stack 104 is present under each bridge area 201, as descried herein, and acts as a bridge mechanism for connecting neighboring regions of the metal layer or layer stack 112 while also isolating the metal layer or layer stack 112 from an underlying conductive structure e.g. in the case of a gate finger, a source finger, a metal connection of a sensor such as a current or temperature, etc.

Figure 6:
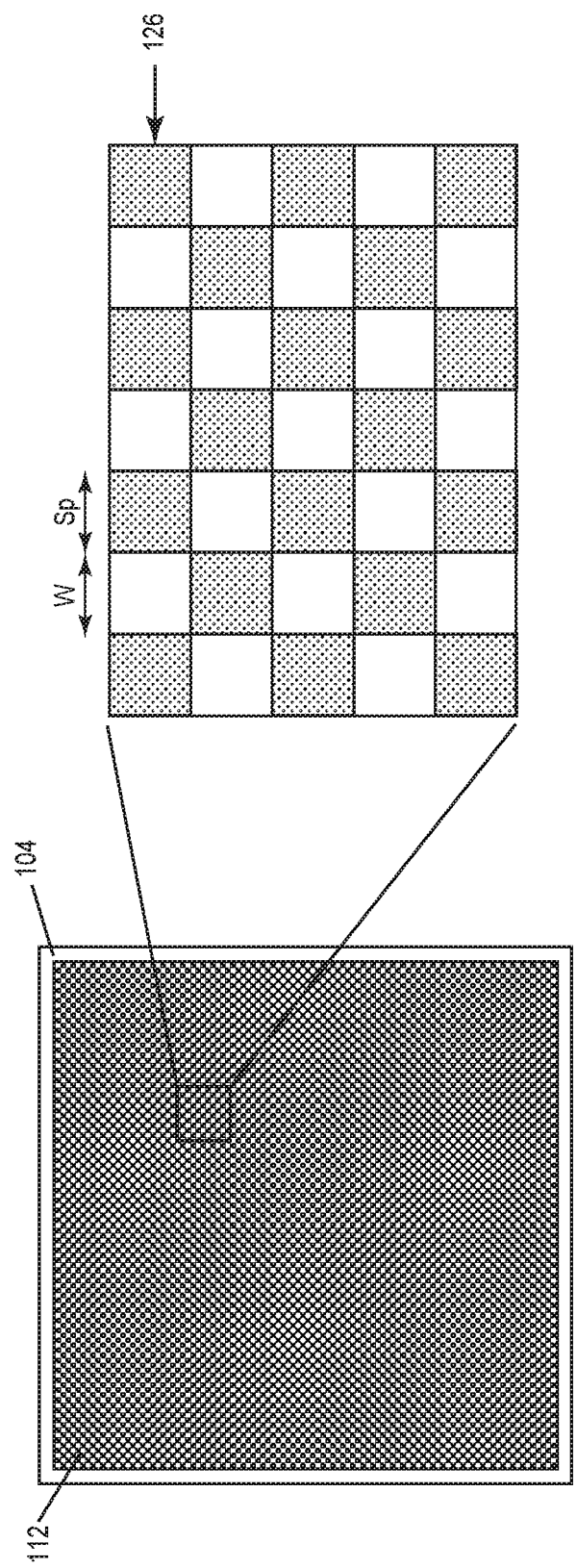
FIG. 6 illustrates a plan view of another embodiment of the metal layer or layer stack formed on the stress relieving layer or layer stack.

FIG. 6 illustrates a plan view of another embodiment of the metal layer or layer stack 112 formed on the stress relieving layer or layer stack 104. According to this embodiment, the openings 108 in the stress relieving layer or layer stack 104 are arranged in a checkerboard pattern so that the patterned surface topography of the stress relieving layer or layer stack 104 has a checkerboard pattern which is transferred to the metal layer or layer stack 112. The spacing (Sp) between adjacent ones of the openings 108 in the same row 126 of openings 108 in the stress relieving layer or layer stack 104 may be approximately equal to the width (W) of the openings 108. Other spacings and widths are contemplated. The spacing (Sp) and the width (W) may be different, and may differ between rows of openings 108 in the stress relieving layer or layer stack 104. The openings 108 in the stress relieving layer or layer stack 104 are not visible in FIG. 6.

Figure 7:
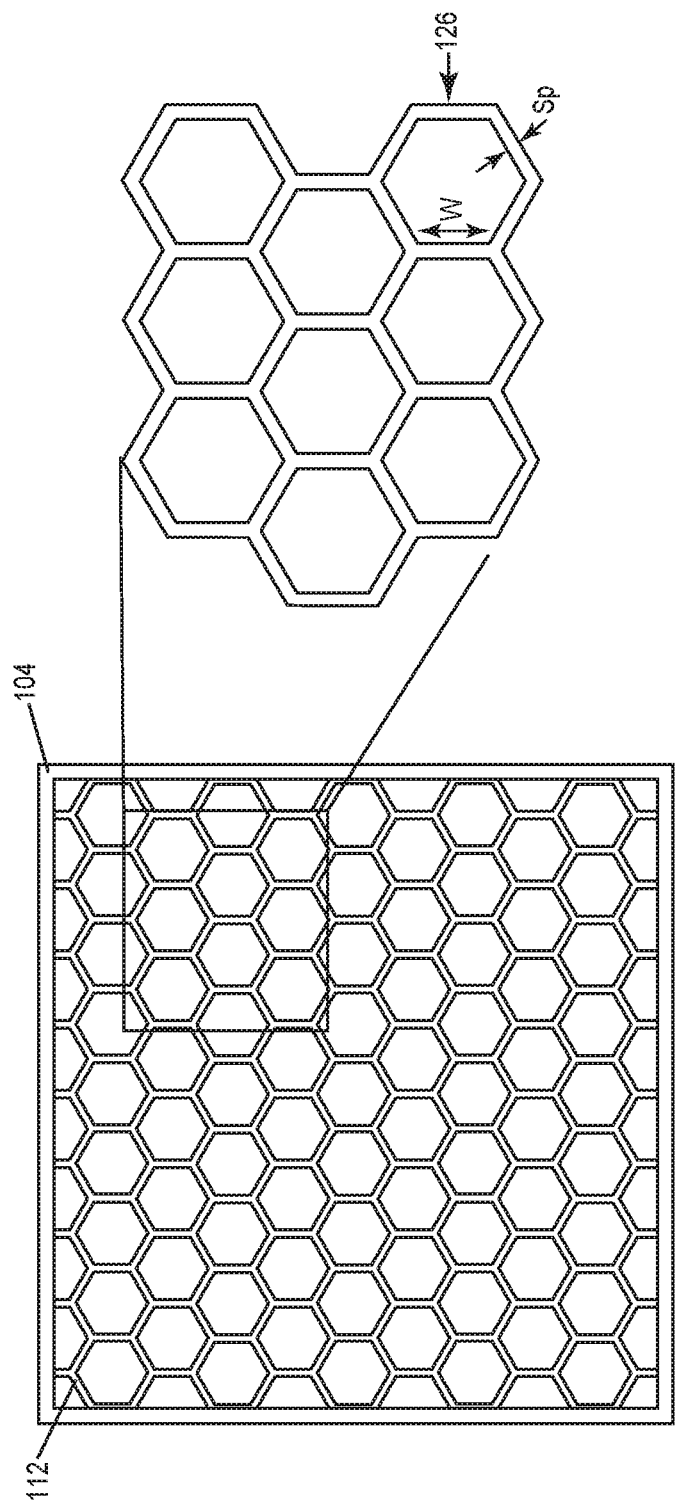
FIG. 7 illustrates a plan view of another embodiment of the metal layer or layer stack formed on the stress relieving layer or layer stack.

FIG. 7 illustrates a plan view of another embodiment of the metal layer or layer stack 112 formed on the stress relieving layer or layer stack 104. According to this embodiment, the openings 108 in the stress relieving layer or layer stack 104 are arranged in a honeycomb pattern so that the patterned surface topography of the stress relieving layer or layer stack 104 has a honeycomb pattern which is transferred to the metal layer or layer stack 112. The spacing (Sp) between adjacent ones of the openings 108 in the same row 126 of openings 108 in the stress relieving layer or layer stack 104 may be approximately equal to the width (W) of the openings 108. Other spacings and widths are contemplated. The spacing (Sp) and the width (W) may be different, and may differ between rows of openings 108 in the stress relieving layer or layer stack 104. The openings 108 in the stress relieving layer or layer stack 104 are not visible in FIG. 7.

Figure 8:
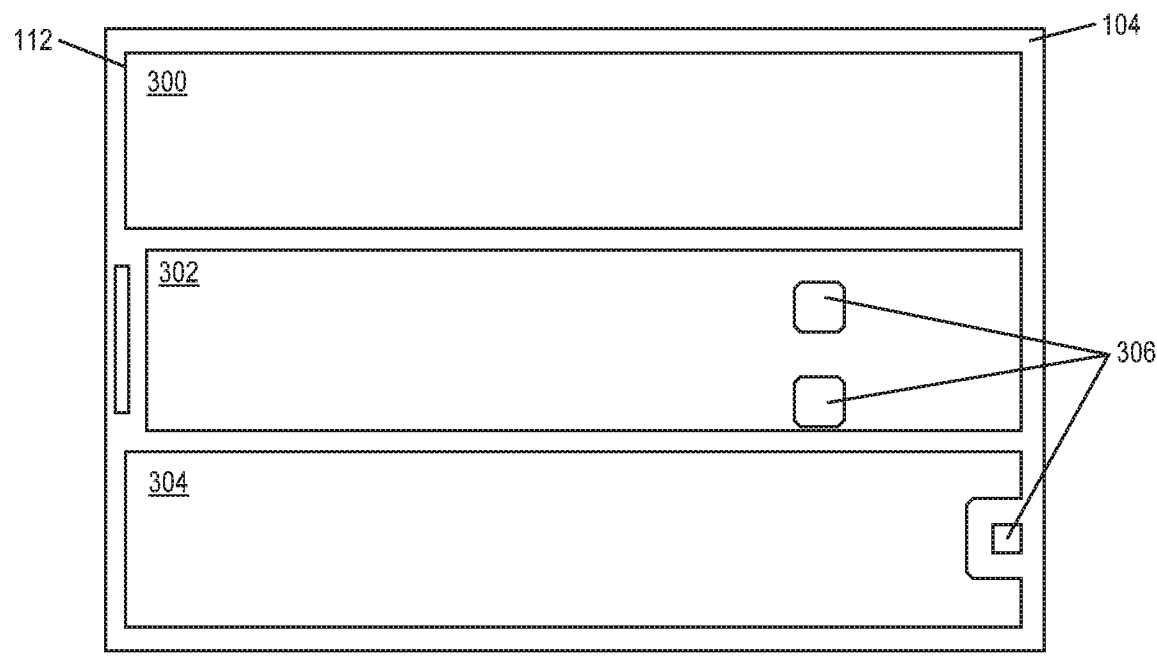
FIG. 8 illustrates a plan view of another embodiment of the metal layer or layer stack formed on the stress relieving layer or layer stack.

FIG. 8 illustrates a plan view of another embodiment of the metal layer or layer stack 112 formed on the stress relieving layer or layer stack 104. According to this embodiment, the metal layer or layer stack 112 covers at least 90% of the semiconductor body 102 and is segmented into separate sections 300, 302, 304. Some of the sections 300, 302, 304 may include contact pads 306, and/or some or all the sections 300, 302, 304 may form contact pads by themselves. In each case, each section 300, 302, 304 of the metal layer or layer stack 112 has the same or substantially same patterned shape as the portion of the surface of the stress relieving layer or layer stack 104 underlying that section 300, 302, 304. The separate sections 300, 302, 304 may be electrically connected by to each other by bridge areas, e.g., as previously described herein in connection with FIG. 5.

Figure 9:
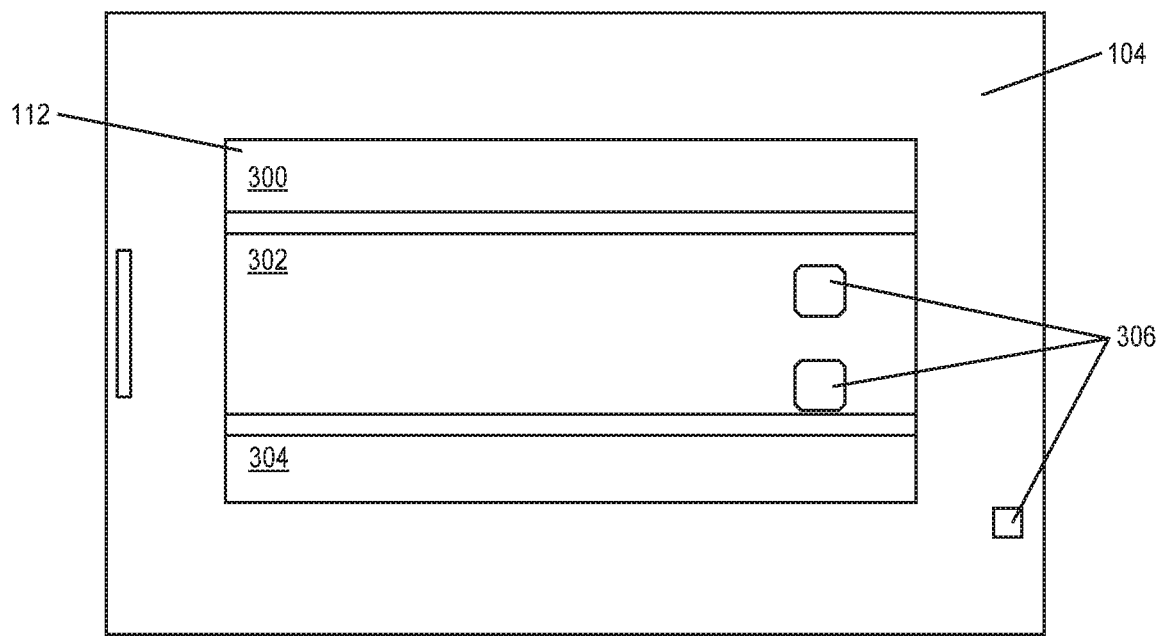
FIG. 9 illustrates a plan view of another embodiment of the metal layer or layer stack formed on the stress relieving layer or layer stack.

FIG. 9 illustrates a plan view of another embodiment of the metal layer or layer stack 112 formed on the stress relieving layer or layer stack 104. The embodiment shown in FIG. 9 is similar to the one shown in FIG. 8. Different, however, the metal layer or layer stack 112 covers less than 90%, e.g. between about 75% to 25%, of the semiconductor body 102.

Figure 10:
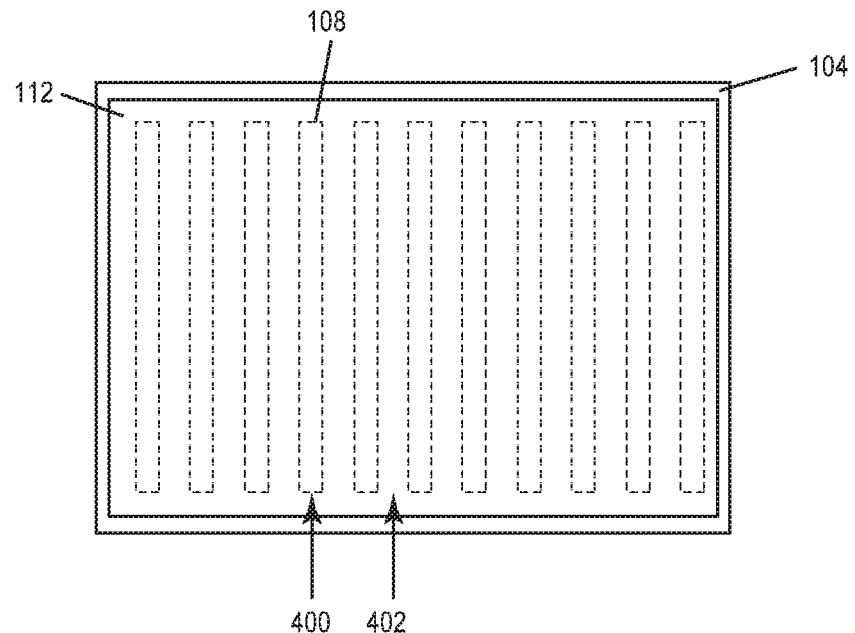
FIG. 10 illustrates a plan view of another embodiment of the metal layer or layer stack formed on the stress relieving layer or layer stack.

FIG. 10 illustrates a plan view of another embodiment of the metal layer or layer stack 112 formed on the stress relieving layer or layer stack 104. According to this embodiment, the stress relieving layer or layer stack 104 has a corrugated profile with alternating ridges 400 and grooves 402 in a transverse cross-section through any row of the plurality of openings 108. The metal layer or layer stack 112 has the same or substantially same corrugated profile as the stress relieving layer or layer stack 104.

Figure 11:
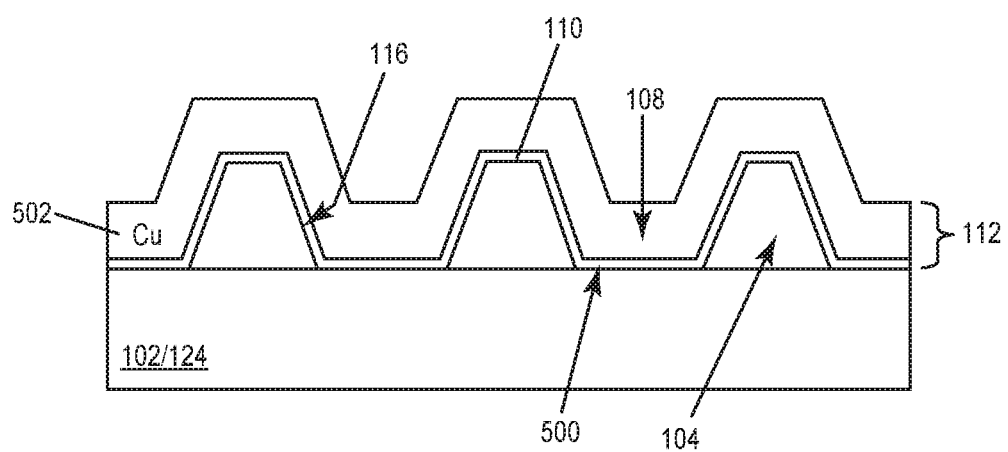
FIG. 11 illustrates a partial cross-sectional view of another embodiment of the metal layer or layer stack formed on the stress relieving layer or layer stack with a smaller elastic modulus than the metal layer or layer stack

FIG. 11 illustrates a partial cross-sectional view of another embodiment of the metal layer or layer stack 112 formed on the stress relieving layer or layer stack 104. According to this embodiment, the metal layer or layer stack 112 includes a barrier metal layer 500 such as WTi, Ta, TaN, TiN, Ti, W, TiW, etc. covering the top main surface 110 of the stress relieving layer or layer stack 104 and sidewalls 116 of the openings 108 in the stress relieving layer or layer stack 104. The metal layer or layer stack 112 includes a copper layer 502 covering the barrier metal layer 500. The barrier metal layer 500 and copper layer 502 may be formed using any common copper metallurgy process such as physical or chemical deposition, electroplating, etc. In some cases, the barrier metal layer 500 may be omitted if the base metal composition of the metal layer or layer stack 112 is less likely to diffuse, e.g., in the case of Cu—Ge alloys such as epitaxial $Cu_3Ge$. The material on which the stress relieving layer or layer stack 104 is formed may be the semiconductor body 102, another layer or layer stack 124, e.g., such as another Cu layer, an AlCu layer, etc., or an insulating layer, e.g., such as oxide, nitride, silicon nitride, oxynitride, nitride-based ceramics, SiCOH, etc.

Figure 12:
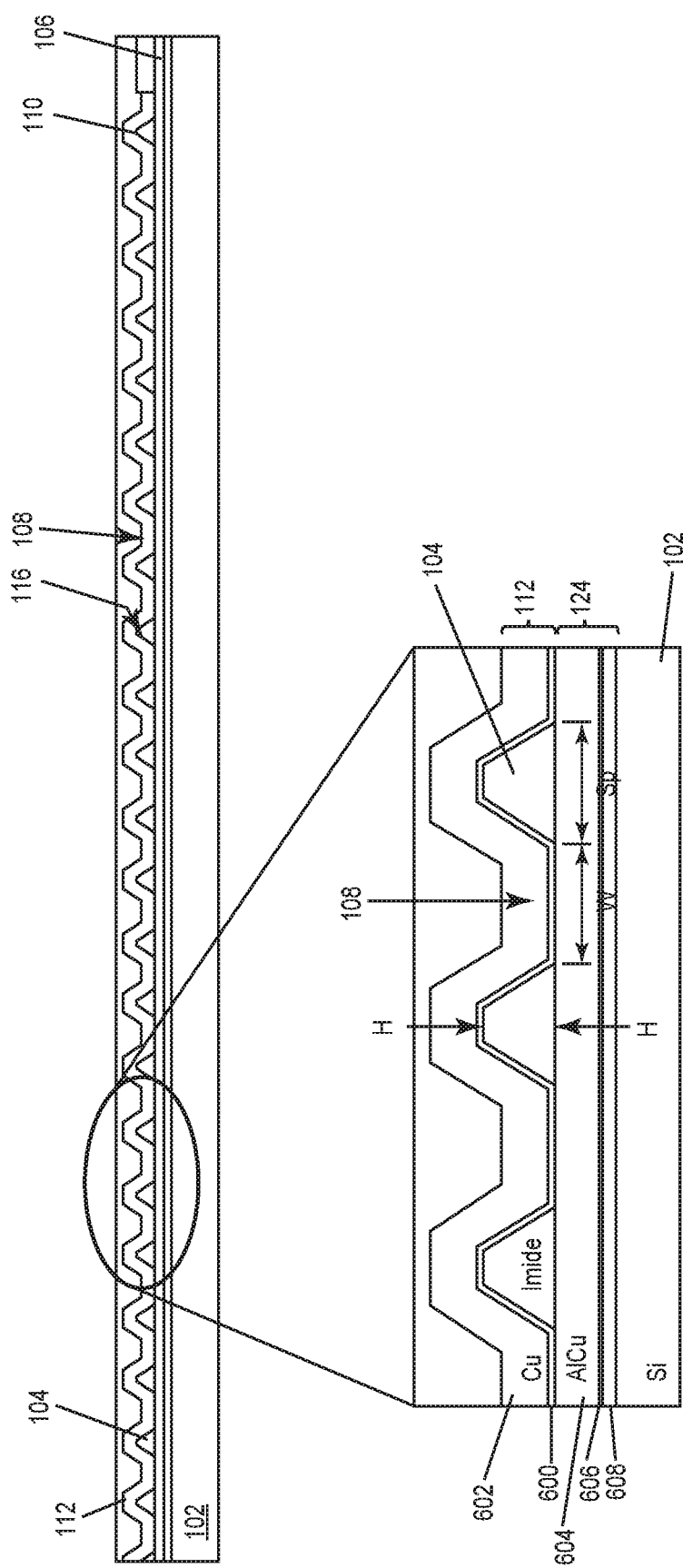
FIG. 12 illustrates a partial cross-sectional view of another embodiment of the metal layer or layer stack formed on the stress relieving layer or layer stack.

FIG. 12 illustrates a partial cross-sectional view of another embodiment of the metal layer or layer stack 112 formed on the stress relieving layer or layer stack 104. The exploded view in FIG. 12 enlarges part of the illustrated semiconductor device. According to this embodiment, the stress relieving layer or layer stack 104 comprises imide and covers the entire main surface 106 of the semiconductor body 102 over which the stress relieving layer or layer stack 104 is disposed. The overlying metal layer or layer stack 112 includes a barrier metal layer 600 such as WTi, Ta, TaN, TiN, etc. covering the top main surface 110 of the stress relieving layer or layer stack 104 and sidewalls 116 of the openings 108 in the stress relieving layer or layer stack 104. The overlying metal layer or layer stack 112 includes a copper layer 602 covering the barrier metal layer 600. The barrier metal layer 600 and copper layer 602 may be formed using any common copper metallurgy process such as physical or chemical deposition, electroplating, etc. The overlying metal layer or layer stack 112 is in electrical contact with an underlying metal layer or layer stack 124 through the openings 108 in the stress relieving layer or layer 104. In one embodiment, the underlying metal layer or layer stack 124 includes an AlCu layer 604 on which the stress relieving layer or layer 104 is formed and a barrier layer 606 such as W, TiW, etc. under the AlCu layer. The barrier layer 606 is separated from the semiconductor body 102 by a dielectric layer 608, e.g., such as borophosphosilicate glass (BPSG). The dielectric layer 608 may have grooves which allow for electrical contact to the semiconductor body 102.

The plurality of openings 108 in the stress relieving layer or layer stack 104 may be arranged in a regular or irregular pattern so that the patterned surface topography of the stress relieving layer or layer stack 104 has a corresponding regular or irregular pattern, respectively. FIG. 12 illustrates an embodiment in which the spacing (Sp) between adjacent ones of the openings 108 in the same row of openings 108 in the stress relieving layer or layer stack 104 is approximately equal to the width (W) of the openings 108. For example, the spacing (Sp) and the width (W) may be approximately 10 μm (microns). Other spacings and widths are contemplated, and the 10 μm example given above is purely illustrative and should not be considered limiting. The spacing (Sp) and the width (W) parameters may be different, and may differ across rows of openings 108 in the stress relieving layer or layer stack 104.

The height or thickness (H) of the stress relieving layer or layer stack 104 may be in a range of about 6 to 11 μm, for example. The inventors have discovered that increasing the height/thickness (H) of an imide-based stress relieving layer or layer stack having a patterned surface topography as described herein from about 6 μm to 11 μm increases bow/warpage at lower temperatures below about 250 C, whereas the bow/warpage remains mostly unchanged for higher temperatures above about 250 C. The height/thickness (H) of the stress relieving layer or layer stack 104 instead may be less than 6 μm or greater than 11 μm. The inventors have also discovered that the bow/warpage change (slope) around 300° C. is flatter for dies with an imide-based stress relieving layer or layer stack having a patterned surface topography as described herein, compared with dies having zero coverage by such a patterned imide-based stress relieving layer or layer stack. This is particularly important as the solidification of solder happens around this temperature, leading to a more stable die attach process with respect to process variation of the die processing.

Figure 13:
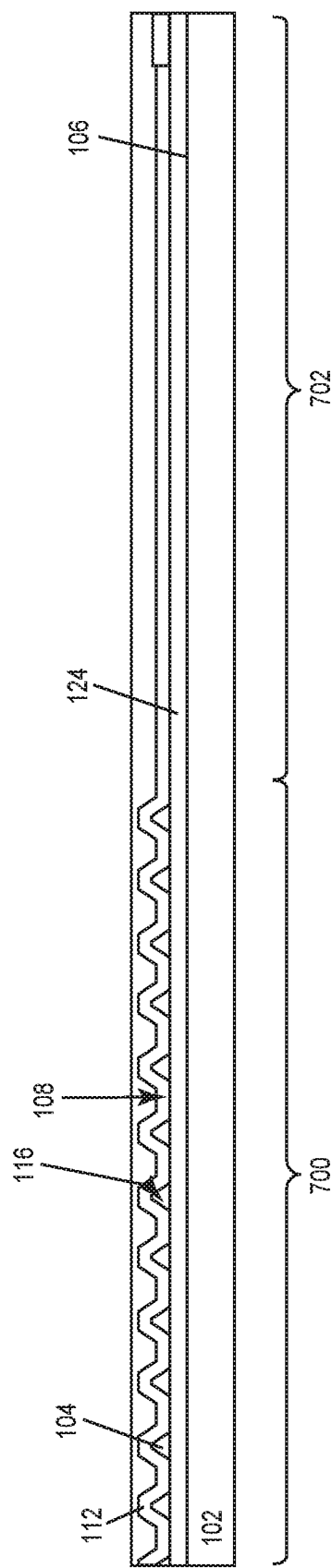
FIG. 13 illustrates a partial cross-sectional view of another embodiment of the metal layer or layer stack formed on the stress relieving layer or layer stack.

FIG. 13 illustrates a partial cross-sectional view of another embodiment of the metal layer or layer stack 112 formed on the stress relieving layer or layer stack 104. The embodiment shown in FIG. 13 is similar to the one shown in FIG. 12. Different, however, the plurality of openings 108 in the stress relieving layer or layer stack 104 are formed over a first part 700 of the semiconductor body 102 and a large opening is formed in the stress relieving layer or layer stack 104 over a second part 702 of the semiconductor body 102 adjacent the first part 700 to provide a generally planar surface topography. The metal layer or layer stack 112 contacts the underlying additional layer or layer stack 124 through the large opening. The inventors have discovered that partial coverage of a die with a stress relieving layer or layer stack having a patterned surface topography as described herein (e.g. about 50% coverage or the inner part of the die) is still beneficial in terms of bow/warpage reduction, but not to the same extent as full coverage. The same also applies for placement of the patterned surface topography on the outer half (periphery) of the die.

In one embodiment, the first part 700 of the semiconductor body 102 is a central part of the semiconductor body 102 and the second part 702 is a periphery region of the semiconductor body 102 which is located along at least one side of the central part or which laterally surrounds the central part in its entirety. The semiconductor device formed in the semiconductor body 102 is disposed in the central part of the semiconductor body 102, which may be considered the active region of the semiconductor body 102. The active region of the semiconductor body 102 is the region of the semiconductor body 102 that includes the constituent parts of the device. For example, the active region may include doped regions of different conductivity types, gate structures, trenches, field plates, ohmic contacts, etc.

FIG. 14 illustrates a cross-sectional view of a semiconductor package 800 that includes the semiconductor device 100 shown in FIG. 1. The semiconductor body 102 of the device 100 is attached to a standard substrate 802 such as a printed circuit board (PCB), lead frame, etc. The semiconductor package 800 also includes a metal connector 804 such as a clip attached at one end to the metal layer or layer stack 112 of the semiconductor device 100. The opposite end of the metal connector 804 is attached to the substrate 802, e.g., to a metal trace of a PCB, to a lead of a lead frame, etc. The metal connector 804 may be joined to the metal layer or layer stack 112 by solder 806. The inventors have discovered that using a metal layer or layer stack having a patterned surface topography as described herein localizes and distributes solder voids in the 'dimpled' or 'depressed' regions 808 of the metal layer or layer stack 112.

In one embodiment, part of the stress relieving layer or layer stack 104 may be free of openings or have a large opening to provide a generally planar surface topography. The metal layer or layer stack 112 may have a contact pad disposed over the generally planar surface topography, e.g., as described previously herein in connection with FIGS. 5, 8 and 9. The metal connector 804 may be attached to the contact pad in this case. Still other metal connector attachment configurations are contemplated and within the scope of the embodiments described herein.

Figure 15A:
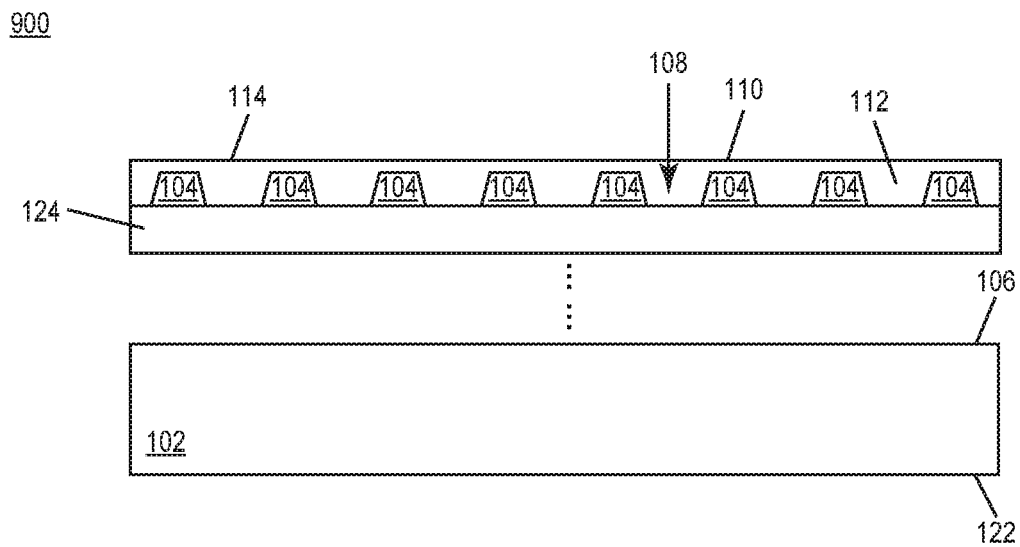
FIGS. 15A and 15B illustrate respective cross-sectional views of part of a semiconductor device having a stress relieving layer or layer stack.
Figure 15B:
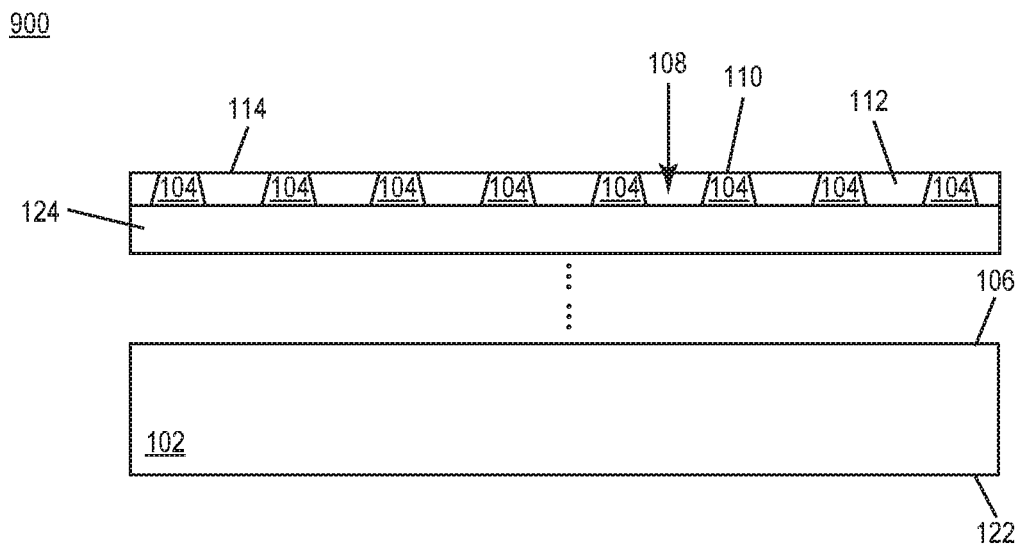

While the embodiments previously described herein describe the surface 114 of the metal layer or layer stack 112 with the patterned topography as being non-planarized, the surface 114 instead may be subjected to a planarization process such as chemical-mechanical polishing (CMP). FIG. 15A illustrates a corresponding a semiconductor device 900. As shown in FIG. 15A, the top surface 114 of the metal layer or layer stack 112 is generally planar. Adequate stress relief is provided by the stress relieving layer or layer stack 104 since the openings 108 in the stress relieving layer or layer stack 104 are filled with metal. In some cases, the top surface 110 of the stress relieving layer or layer stack 104 may be partly visible after planarization of the metal layer or layer stack 112, e.g. as shown in FIG. 15B. The metal layer or layer stack 112 may be recessed below the top surface 110 of the stress relieving layer or layer stack 104 depending on the type of planarization process employed or by design.

Figure 16:
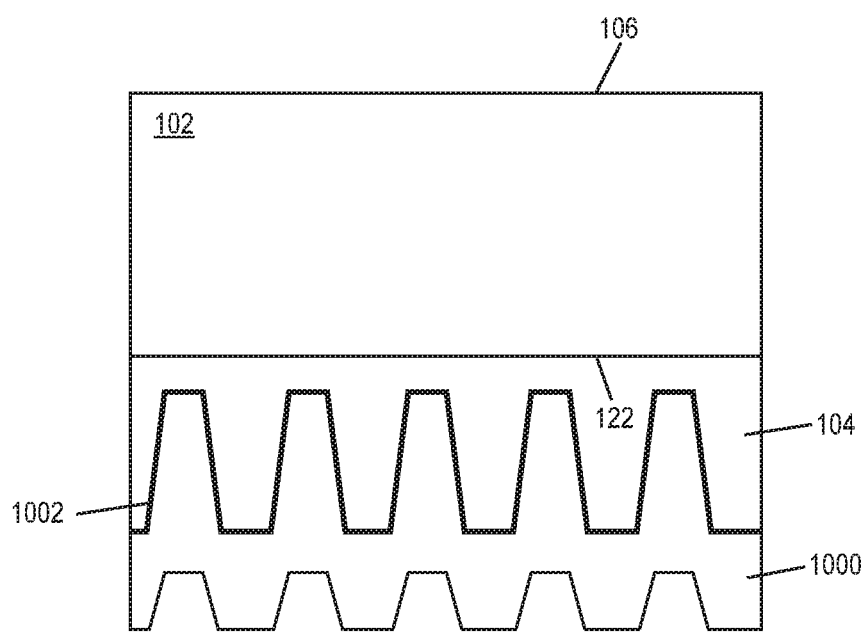
FIG. 16 illustrates a partial cross-sectional view of another embodiment of the metal layer or layer stack formed on the stress relieving layer or layer stack with a higher elastic modulus than the metal layer or layer stack.

FIG. 16 illustrates a partial cross-sectional view of an embodiment in which a copper layer 1000 and a barrier metal layer 1002 are formed on the rear main surface 122 of the semiconductor body 102 to form a back-side metallization stack. According to this embodiment, the stress relieving layer or layer stack 104 has a higher elastic modulus than the back-side metallization stack 1000/1002 over the temperature range of interest. For example, the stress relieving layer or layer stack 104 may comprise doped silicon and/or polysilicon. In the case of doped silicon, the rear main surface 122 of the semiconductor body 102 may be doped with phosphorus, then structured, e.g., by etching, so that the rear main surface 122 of the semiconductor body 102 has recesses. The rear main surface 122 of the semiconductor body 102 is then covered by the barrier metal layer 1002 and the recesses are then filled with the copper layer 1000. The stress relieving layer or layer stack 104 may compensate some of the stress imparted by the back-side metallization stack 1000/1002 during temperature cycling and/or residual stress in a way to reduce the likelihood of die bow/warpage and high mechanical stress, as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor body;
a stress relieving layer or layer stack disposed over at least part of the semiconductor body, the stress relieving layer or layer stack comprising a plurality of openings which yield a patterned surface topography for the stress relieving layer or layer stack; and
a metal layer or layer stack formed on the stress relieving layer or layer stack and occupying the plurality of openings in the stress relieving layer or layer stack,
wherein the patterned surface topography of the stress relieving layer or layer stack is transferred to a surface of the metal layer or layer stack facing away from the semiconductor body,
wherein the stress relieving layer or layer stack has a different elastic modulus than the metal layer or layer stack over a temperature range,
wherein the stress relieving layer or layer stack and the metal layer or layer stack are both formed in an interlayer dielectric which separates different metal layers of the semiconductor device,
wherein the stress relieving layer or layer stack is interposed between the semiconductor body and a final one of the different metal layers,
wherein the plurality of openings in the stress relieving layer or layer stack is arranged in a regular pattern over the entire area of the stress relieving layer or layer stack so that the patterned surface topography of the stress relieving layer or layer stack has a regular pattern which is independent of a layout of any wiring layer of the semiconductor device.

2. The semiconductor device of claim 1, wherein the stress relieving layer or layer stack comprises a material selected from the group consisting of a polymer, an imide, an alloy of aluminum and copper, an oxide, a nitride, silicon nitride, oxynitride, a nitride-based ceramic, and SiCOH.

3. The semiconductor device of claim 1, further comprising a wiring layer on which the stress relieving layer or layer stack is formed, wherein the metal layer or layer stack is in electrical contact with the wiring layer through the plurality of openings in the stress relieving layer or layer stack.

4. The semiconductor device of claim 3, wherein the plurality of openings in the stress relieving layer or layer stack is arranged independent of a layout of the wiring layer.

5. The semiconductor device of claim 1, wherein the metal layer or layer stack is the final metal layer of the semiconductor device and provides one or more points of external electrical contact for a power transistor device formed in the semiconductor body.

6. The semiconductor device of claim 5, wherein part of the stress relieving layer or layer stack is free of openings or has a large opening to provide a generally planar surface topography over which the metal layer or layer stack comprises one or more contact pads.

7. The semiconductor device of claim 1, wherein the plurality of openings in the stress relieving layer or layer stack is arranged in a checkerboard pattern, a honeycomb pattern or in stripes so that the patterned surface topography of the stress relieving layer or layer stack has a checkerboard pattern, a honeycomb pattern or a striped pattern, respectively.

8. The semiconductor device of claim 1, wherein the stress relieving layer or layer stack has a corrugated profile with alternating ridges and grooves in a cross-section through any row of the plurality of openings.

9. The semiconductor device of claim 1, wherein the plurality of openings in the stress relieving layer or layer stack comprises rows of regularly-spaced openings of the same or substantially same shape.

10. The semiconductor device of claim 9, wherein the shape of the regularly-spaced openings is selected from the group consisting of square, rectangular, hexagonal, ellipsoidal, and polygonal.

11. The semiconductor device of claim 1, wherein the stress relieving layer or layer stack covers between 10% and 100% of an entire main surface of the semiconductor body over which the stress relieving layer or layer stack is disposed.

12. The semiconductor device of claim 11, wherein the stress relieving layer or layer stack covers the entire main surface of the semiconductor body over which the stress relieving layer or layer stack is disposed.

13. The semiconductor device of claim 1, wherein the plurality of openings is formed in the stress relieving layer or layer stack over a first part of the semiconductor body, and wherein the stress relieving layer or layer stack is free of openings or has a large opening over a second part of the semiconductor body adjacent the first part to provide a generally planar surface topography for the second part.

14. The semiconductor device of claim 13, wherein the first part of the semiconductor body is a central part of the semiconductor body, and wherein the second part of the semiconductor body is a periphery region of the semiconductor body which laterally surrounds the central part.

15. The semiconductor device of claim 1, wherein the metal layer or layer stack comprises:
a barrier metal layer covering a top main surface of the stress relieving layer or layer stack and sidewalls of the openings in the stress relieving layer or layer stack; and
a copper layer covering the barrier metal layer.

16. The semiconductor device of claim 1, wherein in a same row of the openings in the stress relieving layer or layer stack a spacing between adjacent ones of the openings is approximately equal to a width of the openings.

17. The semiconductor device of claim 1, wherein the metal layer or layer stack comprises copper.

18. The semiconductor device of claim 17, further comprising an AlCu layer on which the stress relieving layer or layer stack is formed, wherein the metal layer or layer stack is in electrical contact with the AlCu layer through the plurality of openings or through a large opening in the stress relieving layer or layer stack.

19. A semiconductor package, comprising:
a semiconductor device comprising:
  a semiconductor body;
  a stress relieving layer or layer stack disposed over at least part of the semiconductor body, the stress relieving layer or layer stack comprising a plurality of openings which yield a patterned surface topography for the stress relieving layer or layer stack; and
  a metal layer or layer stack formed on the stress relieving layer or layer stack and occupying the plurality of openings in the stress relieving layer or layer stack,
  wherein the patterned surface topography of the stress relieving layer or layer stack is transferred to a surface of the metal layer or layer stack facing away from the semiconductor body,
  wherein the stress relieving layer or layer stack has a different elastic modulus than the metal layer or layer stack over a temperature range,
  wherein the stress relieving layer or layer stack and the metal layer or layer stack are both formed in an interlayer dielectric which separates different metal layers of the semiconductor device,
  wherein the stress relieving layer or layer stack is interposed between the semiconductor body and a final one of the different metal layers; and
a metal connector attached to the metal layer or layer stack,
wherein the metal connector is a metal clip joined to the metal layer or layer stack by solder,
wherein the patterned surface topography of the stress relieving layer or layer stack transferred to the surface of the metal layer or layer stack facing away from the semiconductor body localizes and distributes solder voids in the dimpled or depressed regions of the metal layer or layer stack.

20. The semiconductor package of claim 19, wherein part of the stress relieving layer or layer stack is free of openings or has a large opening to provide a generally planar surface topography over which the metal layer or layer stack comprises a contact pad, and wherein the metal connector is attached to the contact pad.

21. The semiconductor device of claim 1, wherein the semiconductor body comprises an active region which includes constituent parts of a device and a periphery region which laterally surrounds the active region, and wherein the plurality of openings in the stress relieving layer or layer stack are formed over the entire active region.

22. A semiconductor device, comprising:
a semiconductor body;
a stress relieving layer or layer stack disposed over at least part of the semiconductor body, the stress relieving layer or layer stack comprising a plurality of openings which yield a patterned surface topography for the stress relieving layer or layer stack; and
a metal layer or layer stack formed on the stress relieving layer or layer stack and occupying the plurality of openings in the stress relieving layer or layer stack,
wherein the patterned surface topography of the stress relieving layer or layer stack is transferred to a surface of the metal layer or layer stack facing away from the semiconductor body,
wherein the stress relieving layer or layer stack has a different elastic modulus than the metal layer or layer stack over a temperature range,
wherein the stress relieving layer or layer stack and the metal layer or layer stack are both formed in an interlayer dielectric which separates different metal layers of the semiconductor device,
wherein the stress relieving layer or layer stack is interposed between the semiconductor body and a final one of the different metal layers,
wherein the semiconductor body comprises an active region which includes constituent parts of a device and a periphery region which laterally surrounds the active region,
wherein the plurality of openings in the stress relieving layer or layer stack are formed over the entire active region.

* * * * *